United States Patent
Lee

(10) Patent No.: US 6,453,496 B1
(45) Date of Patent: Sep. 24, 2002

(54) APPARATUS FOR REMOVING CONTAMINANT PARTICLES ON A PHOTOMASK

(75) Inventor: Byung Chul Lee, Kyunggi-Do (KR)

(73) Assignee: Anam Semiconductor, Inc., Kyung Gi-Do (KR)

(*) Notice: Subject to any disclaimer, the term of this patent is extended or adjusted under 35 U.S.C. 154(b) by 0 days.

(21) Appl. No.: 09/625,009

(22) Filed: Jul. 25, 2000

(51) Int. Cl.[7] .................... A47L 13/40; A47L 25/00
(52) U.S. Cl. ............................. 15/1; 15/1.51
(58) Field of Search ........................ 15/1, 1.51

(56) References Cited

U.S. PATENT DOCUMENTS 4,744,833 A * 5/1988 Cooper

FOREIGN PATENT DOCUMENTS

JP 404027190 * 1/1992

* cited by examiner

*Primary Examiner*—Randall E. Chin
(74) *Attorney, Agent, or Firm*—Katten Muchin Zavis Rosenman

(57) ABSTRACT

An apparatus for removing undesired particles on a target object comprises an electrostatic charge inductor for attracting the undesired particles on the target object, an electrostatic charge developer coming into contact with the electrostatic charge inductor, and a driving source for rotating the electrostatic charge developer. The electrostatic charge developer is rotated by the driving source to be rubbed by the electrostatic charge inductor, which in turn charges the electrostatic charge inductor with negative electricity. The charged inductor attracts the undesired particles off the target object, thereby removing the undesired particles therefrom.

10 Claims, 2 Drawing Sheets

APPARATUS FOR REMOVING CONTAMINANT PARTICLES ON A PHOTOMASK

FIELD OF THE INVENTION

The present invention relates to an apparatus for removing undesired particles on a photomask that may cause defects during a semiconductor lithography; and, more particularly, to an apparatus for removing the undesired particles from the photomask by using an electrostatic force.

BACKGROUND OF THE INVENTION

The presence of an undesired particle on a photomask may cause a critical defect in a semiconductor wafer when the contaminated photomask is used for semiconductor lithography. Since patterns of the photomask are highly miniaturized and transcribed on a semiconductor device, even the smallest particles may render a resultant semiconductor device useless.

In the prior art, therefore, there is known a wealth of apparatuses and/or methods used to remove contaminant particles on the photomask. One of such prior art methods is taught in U.S. Pat. No. 4,744,833 to Douglas W. Cooper et al., entitled "ELECTROSTATIC REMOVAL OF CONTAMINANTS". The method includes the steps of: establishing a first electrically conductive base connected to one terminal of a DC supply, locating a surface on which the contaminant particles are attached on the first conductive base, positioning a second electrically conductive base connected to the other terminal of the DC supply above the surface on which the contaminant particles are attached, placing an insulator between the second base and the surface on which the contaminant particles are attached, and applying an electric field between the first and the second base to electrostatically remove the contaminant particles.

In operation, when the DC supply is driven, the first conductive base charges the contaminant particles at the same potential as the surface and sets up an electrostatic field between the first and the second conductive bases. The thickness of the insulator and the voltage difference between the bases produce an electric field, thereby removing the contaminant particles from the surface.

However, such method requires the conductive bases, insulator, DC supply, etc., which render the entire structure rather complicated and costly.

SUMMARY OF THE INVENTION

It is, therefore, a primary object of the present invention to provide a simple-structured apparatus for removing contaminant particles on a photomask.

It is another object of the present invention to provide an apparatus for removing contaminant particles on the photomask without damaging the photomask.

In accordance with the present invention, there is provided an apparatus for removing undesired particles on a target object, comprising:

an electrostatic charge inductor for attracting the undesired particles on the target object;

an electrostatic charge developer coming into contact with the electrostatic charge inductor; and a driving source for rotating the electrostatic charge developer to cause a frictional contact with the electrostatic charge inductor, wherein the static electricity for removing the undesired particles off the target object is generated by the frictional contact between the electrostatic charge inductor and the electrostatic charge developer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
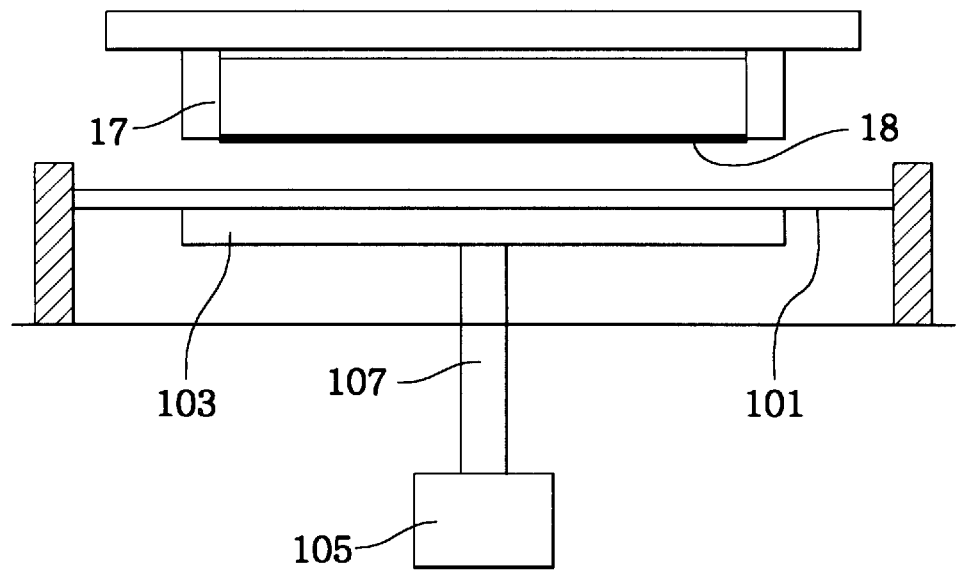
FIG. 1 shows an arrangement of an apparatus for removing contaminant particles on a photomask by using an electrostatic force in accordance with a first preferred embodiment of the invention.

There is shown in FIG. 1, an arrangement of an apparatus for removing contaminant particles on a photomask 17 by using an electrostatic force in accordance with a first preferred embodiment of the invention.

As shown, the apparatus in accordance with the first preferred embodiment of the invention is disposed below a surface 18 of a target object, e.g., a photomask 17, on which contaminant particles are attached, and comprises an electrostatic charge inductor 101 made of, e.g., mica and installed below the photomask 17 so as to face the surface 18 of the photomask 17, an electrostatic charge developer 103 made of, e.g., a metal and disposed on the electrostatic charge inductor 101 so as to come into contact with bottom of the electrostatic charge inductor 101, and a motor assembly for rotating the electrostatic charge developer 103.

The electrostatic charge inductor 101 and the electrostatic charge developer 103, in conjunction with each other, function to generate static electricity. The motor assembly includes a motor 105 as a driving source and a motor shaft 107 for conveying the driving force from the motor 105 to the electrostatic charge developer 103.

In such an arrangement, when the motor 105 is driven, the electrostatic charge developer 103 connected to the motor shaft 107 rotates to cause a frictional contact with the electrostatic charge inductor 101, thereby charging the electrostatic charge inductor 101 and the electrostatic charge developer 103 with positive electricity and negative electricity, respectively. The charged inductor 101 attracts the contaminant particles on the surface 18 of the photomask 17, thereby removing the contaminant particles therefrom.

Figure 2:
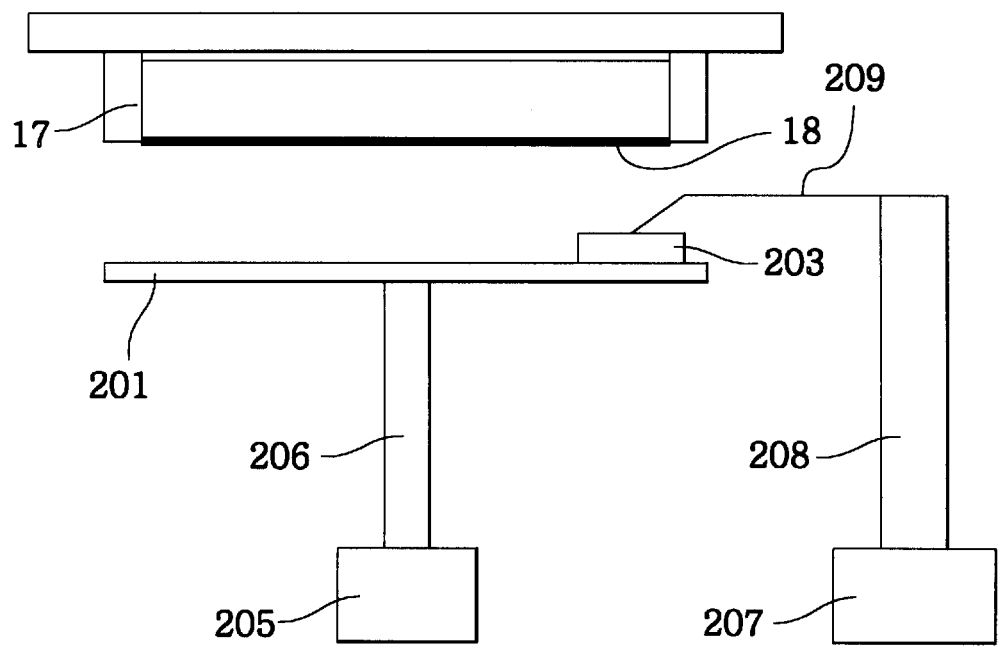
FIG. 2 illustrates an arrangement of an apparatus for removing contaminant particles on a photomask by using an electrostatic force in accordance with a second preferred embodiment of the invention.

There is shown in FIG. 2, an arrangement of an apparatus for removing contaminant particles on the photomask 17 by using an electrostatic force in accordance with a second preferred embodiment of the invention.

As shown, the apparatus in accordance with the second preferred embodiment of the invention is disposed below the surface 18 of a target object, e.g., the photomask 17 on which the contaminant particles are attached, and comprises an electrostatic charge inductor 201 made of, e.g., mica and installed below the photomask 17 so as to face the surface 18 of the photomask 17, an electrostatic charge developer 203 made of, e.g., a metal and disposed on the electrostatic charge inductor 201, a first motor assembly for rotating the electrostatic charge inductor 201 in a predetermined direction and a second motor assembly for rotating the electrostatic charge developer 203 in a reverse direction to the rotational direction of the electrostatic charge inductor 201.

The electrostatic charge inductor 201 is of a disc shape and the first motor assembly includes a first motor 205 as a driving source and a first motor shaft 206 for conveying the driving force from the first motor 205 to the electrostatic charge inductor 201. The electrostatic charge developer 203 is of a disc shape having a smaller diameter than that of the electrostatic charge inductor 201. The second motor assembly has a second motor 207 as a driving source, a second motor shaft 208 for conveying the driving force from the second motor 207, and an arm 209 connecting the second motor shaft 208 to the electrostatic charge developer 203, for rotating the electrostatic charge developer 203 and making it travel along a desired path on the electrostatic charge inductor 201 by using the driving force of the second motor 207.

In such an arrangement, when the first and the second motors 205, 207 are driven, the electrostatic charge inductor 201 connected to the first motor shaft 206 rotates in a constant direction and the electrostatic charge developer 203 rotates in a reverse direction to the rotational direction of the electrostatic charge inductor 201. Accordingly, the electrostatic charge inductor 201 and the electrostatic charge developer 203 are rubbed by each other, thereby being charged with positive electricity and negative electricity, respectively. The charged inductor 201 attracts the contaminant particles on the surface 18 of the photomask 17, thereby removing the contaminant particles therefrom. In particular, since the electrostatic charge developer 203 has a smaller diameter than that of the electrostatic charge inductor 201, it is possible for the electrostatic charge inductor 201 to be partially charged with electricity. To be more specific, the driving force conveyed from the second motor 207 to the electrostatic charge developer 203 via the second motor shaft 208 and the arm 209 allows the electrostatic charge developer 203 to rotate in the predetermined direction and at the same time, travel along the desired path on the electrostatic charge inductor 201, i.e., along the surface of the electrostatic charge inductor 201 corresponding to the surface 18 of the photomask 17 on which the contaminant particles are attached. This embodiment has the advantage of the efficient removal of the contaminant particles on the photomask.

Figure 3:
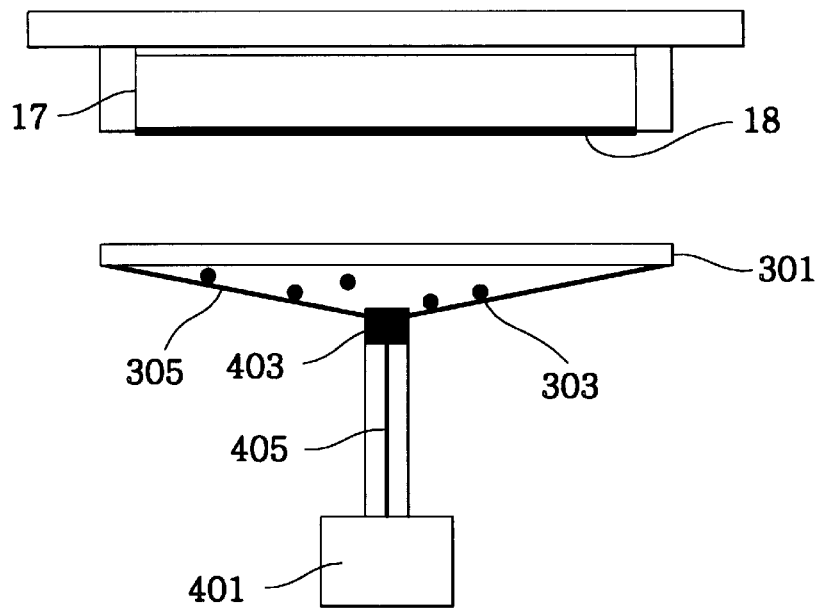
FIGS. 3 and 4 present an arrangement and a view setting forth an operation of an apparatus for removing contaminant particles on a photomask by using an electrostatic force in accordance with a third preferred embodiment of the invention.
Figure 4:
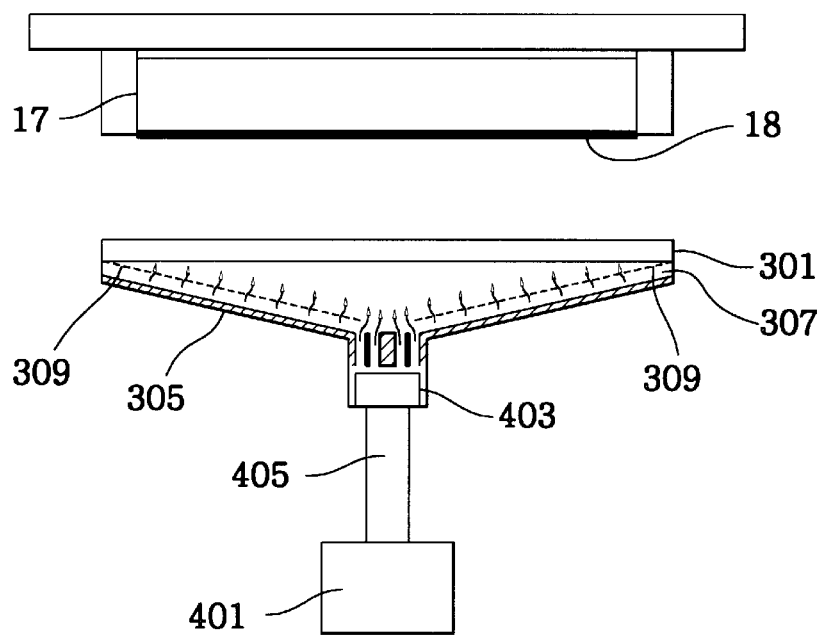

There are shown in FIGS. 3 and 4 an arrangement and a view setting forth an operation of an apparatus for removing contaminant particles on a photomask 17 by using an electrostatic force in accordance with a third preferred embodiment of the invention.

Referring to FIG. 3, the apparatus in accordance with the third preferred embodiment of the invention is disposed below the surface 18 of a target object, e.g., the photomask 17 on which the contaminant particles are attached, and includes an electrostatic charge inductor 301 made of, e.g., mica and installed below the photomask 17 so as to face the surface 18 of the photomask 17, a plurality of spherical materials 303 made of, e.g., a metal and acting as an electrostatic charge developer in conflict with the electrostatic charge inductor 301, as will be described later, a funnel-shaped chamber 305 installed immediately below the electrostatic charge inductor 301, for accommodating the spherical materials 303, and a motor assembly for moving the spherical materials 303.

The motor assembly includes a motor 401 as a driving source, a blower 403 for generating an airflow installed at a corner of the chamber 305 so as to be able to communicate with hollow tubes 307 of the chamber 305, as will be described later, and a motor shaft 405 for conveying a driving force from the motor 401 to the blower 403. Referring to FIG. 4, the funnel-shaped chamber 305 has a plurality of hollow tubes 307. The hollow tubes 307 are radiatedly disposed at bottom of the chamber 305 and each thereof is evenly formed with, a plurality of through-holes 309 for distributing the air flow from the blower 403 into an interior of the chamber 305.

When the motor 401 is driven, its driving force is conveyed to the blower 403 via the motor shaft 405 to activate the blower 403. The air flow generated by the blower 403 is evenly fed into the interior of the chamber 305 through the through-holes 309 of the hollow tubes 307, which, in turn, moves the spherical materials 303. In this case, by a frictional contact between the spherical materials 303 and the electrostatic charge inductor 301, the spherical materials 303 and the electrostatic charge inductor 301 are charged with negative and positive electricity, respectively. The charged inductor 301 attracts the contaminant particles on the photomask 17, thereby removing the contaminant particles therefrom.

In such an inventive apparatus, since the electrostatic charge inductor and developer are the only parts required, the apparatus has a simple structure. Further, by using the static electricity, it is possible to remove the contaminant particles on a photomask without damaging the photomask.

While the invention has been shown and described with respect to the preferred embodiments, it will be understood by those stilled in the art that various changes and modifications may be made without departing from the spirit and scope of the invention as defined in the following claims.

What is claimed is:

1. An apparatus for removing undesired particles from a target object, comprising:

means for generating a static electricity, the static electricity functioning to remove the undesired particles off the target object, wherein the static electricity generating means includes an electrostatic charge inductor for attracting the undesired particles from the target object and an electrostatic charge developer coming into a frictional contact with the electrostatic charge inductor to thereby generate the static electricity.

2. The apparatus of claim 1, further comprising a driving source for rotating the electrostatic charge developer.

3. The apparatus of claim 1, further comprising a first driving source for rotating the electrostatic charge inductor in a predetermined direction and a second driving source for rotating the electrostatic charge developer in a reverse direction to the rotational direction of the electrostatic charge inductor.

4. The apparatus of claim 1, wherein the electrostatic charge inductor and the electrostatic charge developer are made of mica and a metal, respectively.

5. The apparatus of claim 1, wherein the electrostatic charge inductor has a disc shape and the electrostatic charge developer is of a disc shape having a smaller diameter than that of the electrostatic charge inductor.

6. The apparatus of claim 1, wherein a plurality of spherical materials acts as the electrostatic charge developer; and wherein, the static electricity generating means further includes a chamber, installed immediately below the electrostatic charge inductor, for accommodating the spherical materials, and a motor assembly for moving the spherical materials.

7. The apparatus of claim 6, wherein the electrostatic charge inductor and the spherical materials are made of mica and a metal, respectively.

8. The apparatus of claim 6, wherein the chamber is of a funnel shape and has a plurality of hollow tubes, the hollow tubes being radiatedly disposed at bottom of the chamber and each thereof being evenly formed with a plurality of through-holes so as to be able to communicate with the interior of the chamber.

9. The apparatus of claim 8, wherein the motor assembly has a motor, a blower installed at a corner of the chamber so as to be able to communicate with the hollow tubes of the chamber for generating an air flow, and a motor shaft for conveying a driving force from the motor to the blower.

10. The apparatus of claim 1, further comprising means for moving the electrostatic charge developer to thereby make the electrostatic charge developer come into the frictional contact with the electrostatic charge inductor.

* * * * *